(12) United States Patent
Eckel

(10) Patent No.: US 8,854,109 B2
(45) Date of Patent: Oct. 7, 2014

(54) METHOD FOR CONTROLLING TWO ELECTRICALLY SERIES-CONNECTED REVERSE CONDUCTIVE IGBTS OF A HALF BRIDGE

(75) Inventor: Hans-Günter Eckel, Rostock (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 13/984,790

(22) PCT Filed: Jan. 13, 2012

(86) PCT No.: PCT/EP2012/050503
§ 371 (c)(1),
(2), (4) Date: Aug. 9, 2013

(87) PCT Pub. No.: WO2012/107258
PCT Pub. Date: Aug. 16, 2012

(65) Prior Publication Data
US 2013/0321062 A1 Dec. 5, 2013

(30) Foreign Application Priority Data

Feb. 10, 2011 (DE) .......................... 10 2011 003 938

(51) Int. Cl.
| H03K 17/30 | (2006.01) |
| H03K 17/16 | (2006.01) |
| H03K 17/567 | (2006.01) |
| H02M 1/084 | (2006.01) |

(52) U.S. Cl.
CPC .............. *H03K 17/16* (2013.01); *H03K 17/168* (2013.01); *H03K 17/567* (2013.01); *H03K 2217/00036* (2013.01); *H02M 1/0845* (2013.01)
USPC ............ 327/382; 327/380; 327/392; 327/398

(58) Field of Classification Search
USPC .................................. 327/380–382, 392, 398
See application file for complete search history.

(56) References Cited

U.S. PATENT DOCUMENTS

| 7,480,160 B2 | 1/2009 | Bakran et al. |
| 7,582,939 B2 | 9/2009 | Bakran et al. |

(Continued)

FOREIGN PATENT DOCUMENTS

| DE | 102 06 392 A1 | 9/2003 |
| DE | 10 2009 001 029 A1 | 8/2010 |

(Continued)

OTHER PUBLICATIONS

International Search Report issued by the European Patent Office in International Application PCT/EP2012/050503 on Oct. 1, 2012.

(Continued)

*Primary Examiner* — An Luu
(74) *Attorney, Agent, or Firm* — Henry M Feiereisen LLC

(57) ABSTRACT

A method for controlling two electrically series-connected reverse-conductive (RC) IGBTs (RC-IBGT) of a half bridge is disclosed, wherein an operating DC voltage is applied across the series connection and one of the two series-connected reverse-conductive IGBTs operates in IGBT mode and another of the two series-connected reverse-conductive IGBTs operates in diode mode, and wherein each of the two reverse-conductive IGBTs has three switching states "+15V", "0V", "−15V". The RC-IGBT T1 operated in diode mode does not go into the switching state (−15V) of highly charged carrier concentration, but instead into a state of medium charge carrier concentration associated with the switching state "0V", and not into the switching state "−15V", as is known from conventional methods. This reduces the reverse-recovery without adversely affecting the forward voltage.

24 Claims, 10 Drawing Sheets

(56) References Cited

U.S. PATENT DOCUMENTS

| | | | |
|---|---|---|---|
| 8,729,914 B2 * | 5/2014 | Domes | 324/686 |
| 2008/0060542 A1 | 3/2008 | Bakran et al. | |
| 2012/0092912 A1 | 4/2012 | Eckel | |

FOREIGN PATENT DOCUMENTS

| DE | 10 2009 030 738 A1 | 12/2010 |
|---|---|---|
| DE | 10 2009 030 739 A1 | 12/2010 |
| DE | 10 2009 030 740 A1 | 12/2010 |

OTHER PUBLICATIONS

M. Rahimo et al.:"A high current 3300 V module employing Reverse Conducting IGBTs, setting a new benchmark in output power capability", ISPSD 2008, May 18-22, 2008, p. 68-71, ISBN: 978-1-4244-1532-8.

Realization of Higher Output Power Capability with the Bi-Mode Insulated Gate Transistor (BIGT); M. Rahimo, U. Schlapbach, R. Schnell, A. Kopta, J. Vobecky, A. Baschnagel EPE 2009 Barcelona; 2009.

* cited by examiner

US 8,854,109 B2

METHOD FOR CONTROLLING TWO ELECTRICALLY SERIES-CONNECTED REVERSE CONDUCTIVE IGBTS OF A HALF BRIDGE

CROSS-REFERENCES TO RELATED APPLICATIONS

This application is the U.S. National Stage of International Application No. PCT/EP2012/050503, filed Jan. 13, 2012, which designated the United States and has been published as International Publication No. WO 2012/107258 A2 and which claims the priority of German Patent Application, Serial No. 10 2011 003 938.4, filed Feb. 10, 2011, pursuant to 35 U.S.C. 119(a)-(d).

BACKGROUND OF THE INVENTION

The invention relates to a method for controlling two electrically series-connected reverse conductive IGBTs of a half bridge, at which a DC operating voltage is present, wherein these reverse conductive IGBTs have three switching states "+15V", "0V" and "−15V".

Reverse conductive IGBTs are also known as RC-IGBTs. An RC-IGBT differs from a conventional IGBT in that the diode function and the IGBT function are combined into one chip. The result is a power semiconductor in which the anode efficiency in the diode mode is dependent on the presence of a gate voltage.

The basic structure of an RC-IGBT is shown in greater detail in cross section in FIG. 1. This structure is known from publication "A High Current 3300V Module Employing Reverse Conductive IGBTs Setting a New Benchmark in Output Power Capability" by M. Rahimo, U. Schlapbach, A. Kopta, J. Vobecky, D. Schneider, A. Baschnagel, published in ISPSD 2008. This basic structure consists of a lightly n-doped substrate $S_n$, which is provided on the collector side with an n-doped layer $F_s$. Applied to this layer $F_s$ is a highly-doped p-layer $S_p$ which for its part is provided with a metal layer $M_K$. Disposed in this highly-doped p-layer $S_p$ are highly-doped n-areas $L_n$, such that said areas lie in the shadow of highly-doped p areas $W_p$ let into the lightly n-doped substrate $S_n$. These are embodied such that these each form a so-called trough around a recessed area of a metal layer $M_E$, which serves as emitter gate of the RC-IGBT. These recesses each break through a metal layer $M_G$, which in relation to the metal layer $M_E$ in each case, which serves as emitter gate of the RC-IGBT, and compared to the lightly n-doped substrate $S_n$, is surrounded by a silicon oxide layer. In addition each recess of the metal layer $M_E$ serving as an emitter gate is surrounded in the trough-shaped, highly-doped p-area $W_p$ by a highly-doped n-layer $S_{n+}$.

With a gate emitter voltage below a threshold voltage of the MOS channel (15V) of a reverse conductive IGBT the anode efficiency is high, whereby the charge carrier density in the conductive state is high and the conductive state voltage is low. By contrast the reverse-recovery charging, the reverse-recovery losses and the switch-on losses of an RC-IGBT opposite the bridge branch are high. With a gate emitter voltage above a threshold voltage (+15V) of the MOS channel of a reverse conductive IGBT the anode efficiency is low, whereby the charge carrier density in the conductive state is low and the conductive state voltage is high. Since the MOS channel is switched on, this RC-IGBT cannot accept any blocking voltage.

Because of this fact an activation, and thus a method for controlling a conventional IGBT, cannot be used with a reverse conductive IGBT. How a method for controlling an RC-IGBT can look is to be found in the publication already mentioned. It is characteristic of this method that the switching state of the reverse conductive IGBT depends not only on a required value of an output voltage of a multi-phase current converter with RC-IGBTs as current converter valves, but also on a direction of current of the collector current.

FIG. 2 shows an equivalent circuit diagram of a bridge branch 2 of a current converter, wherein the RC-IGBTs T1 and T2 are used as current converter valves. This bridge branch 2, also referred to as a half bridge, is connected electrically in parallel by means of two bus bars 6 and 8 to a direct current source 4. The two reverse conductive IGBTs T1 and T2 of the bridge branch 2 are connected electrically in series. A connection point of these two reverse conductive IGBTs T1 and T2 forms an AC voltage-side terminal A, to which a load is able to be connected. The DC voltage source 4 has two capacitors 10 and 12, which are likewise connected electrically in series. A connecting point of these two capacitors 10 and 12 forms a midpoint terminal M. A DC voltage $U_d$ is present at these two capacitors 10 and 12 connected electrically in series. As an alternative, instead of the two capacitors 10 and 12, just one capacitor can also be used, which is disposed between the two bus bars 6 and 8. The midpoint M is then no longer accessible. With an intermediate voltage converter this DC voltage source 4 forms an intermediate voltage circuit, wherein the DC voltage $U_d$ present is then referred to as the intermediate circuit voltage. The bridge branch 2 is present three times in a three-phase converter, especially a pulse converter, which is used as a load-side converter of an intermediate voltage circuit converter. A pulse-width modulated square-wave voltage $U_{AM}$ is present relative to the midpoint terminal M of the DC voltage source 4 at the AC voltage-side output A.

A block diagram of a control and regulation device of a three-phase current converter, especially a pulse current converter of an intermediate voltage circuit converter with the associated semiconductor-like activation facilities 14 of a bridge branch 2 of this current converter, is shown in FIG. 3. A control device 16 generates two desired control signals $S^*_{T1}$, $S^*_{T2}$, $S^*_{T3}$, $S^*_{T4}$, $S^*_{T5}$ and $S^*_{T6}$ as a function of a desired value, for example a rotational speed desired value n*, for each bridge branch. For reasons of clarity only the bridge branch 2 of the three bridge branches of a three-phase current converter is shown. The two desired control signals $S^*_{T1}$ and $S^*_{T2}$ are each fed to a semiconductor-like activation facility 14 of each reverse conductive IGBT T1 and T2 of the bridge branch 2. On the output side an actual control signal $S_{T1}$ or $S_{T2}$ is present in each case, with which a gate G of a respective reverse conductive IGBT T1 or T2 is activated. In this diagram the AC voltage-side terminal of the bridge branch 2 is not labeled with the letter A, as in the diagram depicted in FIG. 1, but with the letter R. The three bridge branches of a three-phase current converter are connected to each other by means of the two bus bars 6 and 8 and are connected electrically in parallel to the DC voltage source 4.

As already mentioned the stationary switching state of the two reverse conductive IGBTs T1 and T2 of a bridge branch 2 is not only dependent on the desired value of an output voltage $u^*_{AM}$, but also on the polarity of an output current $i_A$ of this bridge branch 2. Whenever the reverse conductive IGBT T1 or T2 is to conduct current in the reverse direction (negative collector current, diode mode) it is switched off. In this way the charge carrier concentration in diode mode is raised. The switching states of the two reverse conductive IGBTs T1 and T2 of the bridge branch 2 can be taken from the following table:

| $U_{AO(targ.)}$ | $i_{A(act.)}$ | T1 | T2 |
|---|---|---|---|
| +Ud/2 | >0 | on | off |
| +Ud/2 | <0 | off | off |
| −Ud/2 | >0 | off | off |
| −Ud/2 | <0 | off | on |

FIGS. 4 to 8 respectively show signal waveforms plotted over time t in a diagram for the case in which, for the negative polarity of the output current $i_A$, the reverse conductive IGBT T1 is operated in diode mode and the reverse conductive IGBT T2 is operated in IGBT mode. FIG. 4 shows the waveform of the desired output voltage $u^*_{AM}$ over time t. To enable this desired output voltage $u^*_{AM}$ to be converted, the desired control signals $S^*_{T1}$, and $S^*_{T2}$ are needed, the temporal waveforms of which are shown, plotted over time t, in FIGS. 5 and 6.

At point in time t0 the value of the desired output voltage $u^*_{AM}$ is equal to half the value of the DC voltage $U_d$ present at the DC voltage source 4. This makes the reverse-conductive IGBT T1 operated in diode mode current-conductive. So that this reverse conductive IGBT T1 can conduct current in diode mode, this IGBT must be switched off. In the signal waveform of the diagram according to FIG. 7, which shows the waveform of the gate voltage $u_{GE}$(T1) of the reverse conductive IGBT T1 over the time t, the gate voltage is in the off state (−15V). At this point in time the switching state of the reverse conductive IGBT T2 in accordance with the gate voltage $u_{GE}$(T2) corresponding to FIG. 8 is likewise in the off state. At point in time t1 the desired output voltage $u^*_{AM}$ changes from $+U_d/2$ to $−U_d/2$. At this point in time t1 the desired control signal $S^*_{T1}$ changes from high to low, whereas the desired control signal $S^*_{T2}$ changes from low to high. Through this the reverse conductive IGBT T1 operated in diode mode is switched on for a predetermined period of time $\Delta T_1$, wherein the IGBT T2 operated in IGBT mode remains in the switched-off state. In this predetermined period of time $\Delta T_1$ the reverse conductive IGBT T1 operated in diode mode continues to be current-conductive, whereby the charge carrier concentration falls.

At point in time t2 the reverse conductive IGBT T1 operated in diode mode is switched off again. After a further predetermined period of time $\Delta T_V$ has elapsed, which is also referred to as the blocking time, at point in time t3 the reverse conductive IGBT T2 operated in IGBT mode is switched on (FIG. 8). The commutation from the IGBT T1 operated in diode mode to the reverse conductive IGBT T2 operated in IGBT mode occurs at point in time t3. The blocking time $\Delta T_V$ is necessary in order to avoid a bridge branch short-circuit. This blocking time $\Delta T_V$ again leads however to a rise in the charge carrier concentration in the reverse conductive IGBT T1 operated in diode mode and thus to an increase in the switching losses.

At point in time t5 the desired output voltage $u^*_{AM}$ changes again from $−U_d/2$ to $+U_d/2$. The reverse conductive IGBT T2 operated in IGBT mode remains switched on for a predetermined period of time $\Delta T_2$ calculated from point in time t5, before this IGBT is switched off at point in time t6 and the output current iA commutes to the reverse conductive IGBT T1 operated in diode mode.

So that the effect of the anode efficiency works, the blocking time $\Delta T_V$ should be as small as possible between the switching off of the reverse conductive IGBT T1 operating in diode mode and the switching on of the reverse conductive IGBT T2 operating in IGBT mode. The control method (commutation method) disclosed in the publication cited at the start is time-controlled, which requires high timing precision. If the anode efficiency is high, the conductive voltage is low so that the reverse recovery losses are reduced.

The underlying object of the invention is now to further develop the known method for controlling a reverse conductive IGBT such that the reverse-recovery charge becomes as low as possible in combination with a conductive voltage which is as low as possible, and that in diode mode a high surge withstand strength is achieved.

SUMMARY OF THE INVENTION

According to an aspect of the invention, a method for controlling two electrically series-connected reverse-conductive IGBTs (RC-IBGT) of a half bridge, wherein an operating DC voltage is applied across the series connection and one of the two series-connected reverse-conductive IGBTs operates in IGBT mode and another of the two series-connected reverse-conductive IGBTs operates in diode mode, wherein each of the two reverse-conductive IGBTs has three switching states "+15V", "0V", "15V", includes setting each of the two reverse-conductive IGBTs to the switching state "15V" when a nominal control signal associated with the respective reverse-conductive IGBT has a stationary OFF-state, switching the nominal control signal from the stationary OFF-state into an ON-state at a first switching time, after a first predetermined period of time has elapsed following first switching time, switching the reverse-conductive IGBTs operating in IGBT mode from the switching state "15V" into the switching state "+15V", while maintaining the reverse-conductive IGBTs operating in diode mode in the switching state "15V", switching the nominal control signal from the ON-state into the stationary OFF-state at a second switching time, switching the reverse-conductive IGBTs operating in diode mode into the switching state "+15V" at the second switching time, while maintaining the reverse-conductive IGBTs operating in IGBT mode in the switching state "+15V", after a second predetermined period of time has elapsed following the second switching time, switching each of the two reverse conductive IGBTs into the switching state "0V" for a third predetermined period of time, and after a third predetermined period of time has elapsed, switching each of the two reverse conductive IGBTs into the switching state "15V".

This invention is based on the knowledge that reverse conductive IGBTs have a parasitic highly-doped p zones between contacted p-troughs on the front side of the RC-IGBT. These highly-doped p zones are not contacted. Through these parasitic p-zones the associated reverse conductive IGBT now has three switching states instead of two, namely the switching states "+15V", "0V" and "−15V".

An investigation produced the following table which shows the resulting states for a so-called tri-state RC-IGBT:

| State designation | $u_{GE}$ | Charge carrier concentration when conductive | Blockable | $Q_{RR}$ $W_{RR}$ |
|---|---|---|---|---|
| +15 V | $U_{GE} > U_{th(plus)}$ e.g. +15 V | very low | no | |
| 0 V | $U_{th(plus)} > U_{GE} > u_{th(minus)}$ e.g 0 V | medium | yes | medium |
| 15 V | $u_{th(minus)} > U_{GE}$ e.g. −15 V | high | yes | high |

The switching state "+15V" (first switching state) is set in this case by the gate emitter voltage of the IGBT being brought to a value above the inception voltage, wherein the gate emitter voltage is set typically but not necessarily to 15V. By means of this switching state a conductive electron channel forms in the p-trough such that, on current conduction from emitter to collector, the charge carrier concentration is very low, and that the IGBT is not capable of blocking.

The switching state "0V" (third switching state) is set by the gate emitter voltage of the IGBT being brought to a value below the inception voltage, wherein the gate emitter voltage typically but not necessarily is set to 0V, meaning that no conductive electron channel is formed in the p-trough, wherein, during current conduction from emitter to collector, the charge carrier concentration is medium-high and whereby the IGBT is capable of blocking.

The switching state "−15V" (second switching state) is set by the gate emitter voltage of the IGBT being bought to a value below the inception voltage, wherein the gate emitter voltage is typically but not necessarily set to 15V. This means that no conductive electron channel forms in the p-trough through which, during current conduction from the emitter to collector, the charge carrier concentration is very high and whereby the IGBT is capable of blocking.

The basis of the invention is now that the available three switching states "+15V", "0V" and "−15V" are used for a control method in order to lower the reverse-recovery charging combination with a lowest possible conductive voltage. In addition the surge withstand strength in diode mode is to be increased.

With this method, during a commutation from an RC-IGBT operated in diode mode to an RC-IGBT operated in IGBT mode of a half bridge, by intermediate switching of the third switching state "0V" during switching from the first switching state "+15V" to the second switching state "−15V" it is achieved that the reverse-recovery charge is lower for the same conductive voltage compared to a conventional method. Since this RC-IGBT operated in diode mode is controlled with the exception of the commutation process in the second switching state "−15V", the surge withstand strength is increased.

If the reverse-recovery charge is to be as low as possible with a conductive voltage that is as low as possible then the RC-IGBT operated in the diode mode and the RC-IGBT operated in the IGBT mode are put into the stationary off state in each case not in the second switching state "−15V" but in the third switching state "0V".

If the surge withstand strength is to be as high as possible for the RC-IGBT operated in diode mode, with only slightly reduced reverse-recovery charging, then this RC-IGBT and the RC-IGBT operated in IGBT mode of a half bridge are controlled during a predetermined period of time not in the first switching state "+15V" but in the third switching state "0V" in each case.

If on the other hand only the surge withstand strength of an RC-IGBT operated in diode mode is to be as high as possible, then this RC-IGBT of a half bridge is controlled during a predetermined second and third period of time into the second switching state "−15V". Thus the RC-IGBT operated in diode mode is in the second switching state "−15V" during a controlled switching period.

The predetermined periods of time used in the inventive method are dimensioned such that the first period of time is greater than the second period of time but is smaller than a sum of the second and third period of time. These three predetermined periods of time are stored as numerical values in a facility for carrying out the inventive method, especially in an activation facility of an RC-IGBT of a half bridge in each case. These periods of time are triggered by the positive or negative switching edge of a desired control signal of an RC-IGBT to be activated. With these stored periods of time the inventive method can be easily implemented.

BRIEF DESCRIPTION OF THE DRAWING

For further explanation of the invention the reader is referred to the drawing in which a number of embodiments of the inventive method are schematically shown in the figures, in which FIG. 1 shows a cross-section of a basic structure of a reverse conductive IGBT, in which FIG. 9 shows a cross-section through a reverse conductive IGBT with three switching states, FIGS. 10 to 23 27 and 12, 21, 25 and 29 each show a diagram plotted over time t of a desired control signal of an RC-IGBT in IGBT mode and in diode mode, in which FIGS. 11 and 13 each show in a diagram plotted over time t associated gate voltages in accordance with the inventive method, in which

DETAILED DESCRIPTION OF PREFERRED EMBODIMENTS

Figure 1:
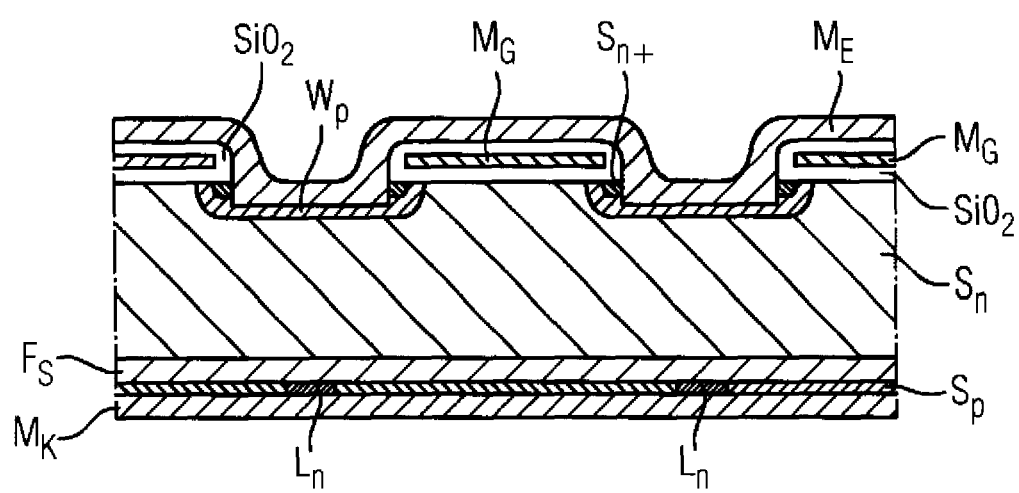
Figure 2:
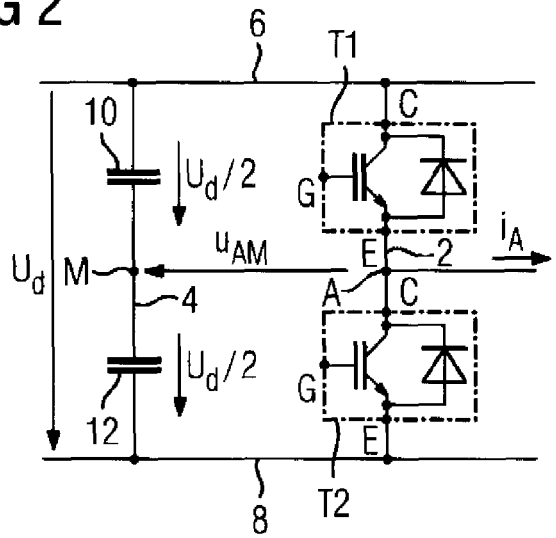
FIG. 2 shows an equivalent circuit diagram of a bridge branch of a current converter with two reverse conductive IGBTs.
Figure 9:
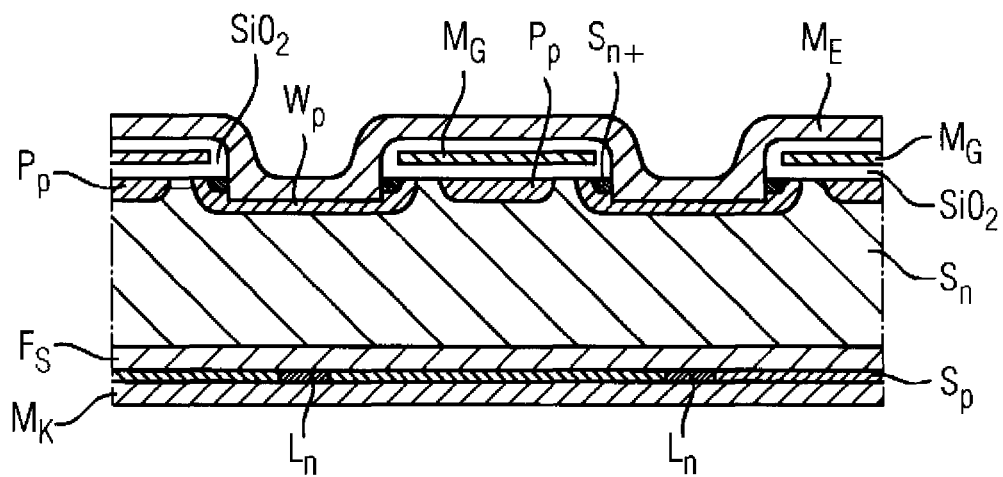

Shown in FIG. 9 is a cross-sectional schematic of an RC-IGBT with three switchable states (+15V, 0V, −15V). This RC-IGBT differs from the RC-IGBT in accordance with FIG. 1 in that this has parasitic highly-doped p zones $P_p$. These highly-doped p zones $P_p$ are disposed between contacted p troughs $W_p$ on the front side of the RC-IGBT. These highly-doped p zones $P_p$ are not contacted with an electrode of the RC-IGBT.

It was now recognized that by these parasitic highly-doped p zones $P_p$ this RC-IGBT has a third switching state of "0V" in relation to a conventional RC-IGBT (FIG. 1), which can also be activated explicitly. As well as the two switching states "+15V" and "−15V" of the conventional RC-IGBT in accordance with FIG. 1, the RC-IGBT also has the switching state "0V" in accordance with FIG. 9.

Figure 10:
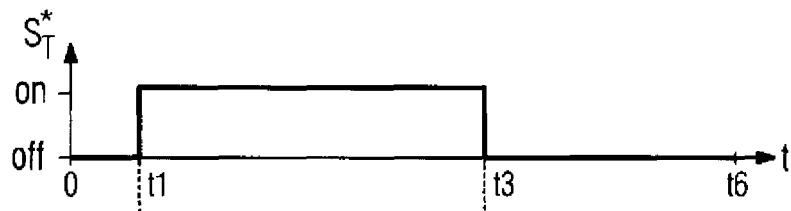
Figure 11:
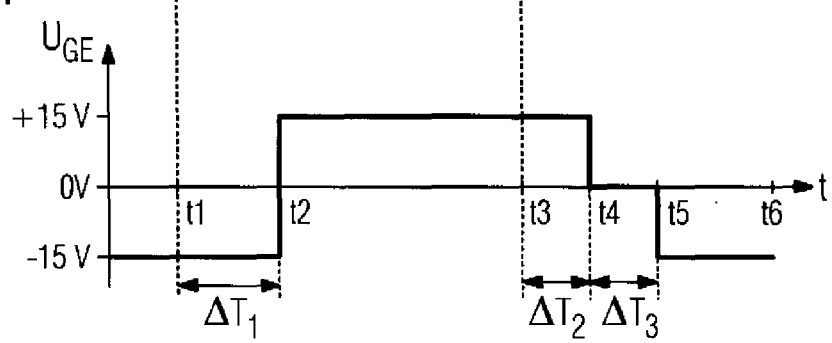
Figure 12:
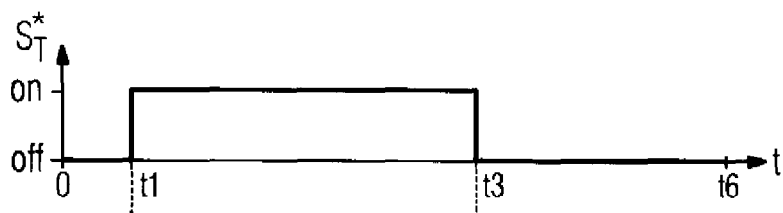

The signal waveforms of FIGS. 10 to 30 are shown in the case in which the output current $i_A$ of the half bridge 2 has negative polarity, the RC-IGBT T1 of this half bridge is being operated in diode mode (negative collector current) and the RC-IGBT T2 of this half bridge 2 is being operated in IGBT mode (positive collector current). FIGS. 10 and 11 show the waveforms of a desired control signal $S^*_T$ and an associated gate voltage $u_{GE}$ of an RC-IGBT operated in IGBT mode, while FIGS. 12 and 13 show the waveforms of a desired control signal S*$_T$ and an associated gate voltage u$_{GE}$ of an RC-IGBT operated in diode mode.

In accordance with the diagram of FIG. 10 the desired control signal S*$_T$ changes at point in time t1 from the off state into the on state. With this positive switching edge a first predefined period of time $\Delta T_1$ is started. At point in time t2 this predefined period of time $\Delta T_1$ has elapsed. As from this point in time t2 the gate voltage u$_{GE}$ of the RC-IGBT operated in IGBT mode changes from switching state "−15V" into switching state "+15V". At point in time t3 the desired control signal S*$_T$ of an RC-IGBT operated in IGBT mode changes from the on state into the off state. With this negative switching edge a second predetermined period of time $\Delta T_2$ is started, which has elapsed by point in time t4. When this second predetermined period of time $\Delta T_2$ has elapsed a third predetermined period of time $\Delta T_3$ is started. This ends at point in time t5. During the second period of time $\Delta T_2$ the gate voltage u$_{GE}$ of the RC-IGBT operated in IGBT mode moves into the switching state "+15V". At point in time t4, at which the second period of time $\Delta T_2$ has elapsed and the third predetermined period of time $\Delta T_3$ is started, the gate voltage u$_{GE}$ changes from switching state "+15V" to switching state "0V". After this third predetermined period of time $\Delta T_3$ has elapsed, i.e. at point in time t5, the gate voltage u$_{GE}$ changes its state from switching state "0V" into switching state "−15V".

Figure 13:
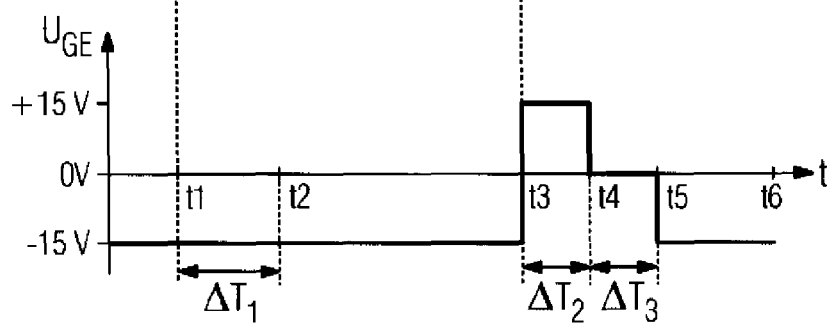

The waveform of the gate voltage u$_{GE}$ of an RC-IGBT operated in diode mode is shown in the diagram of FIG. 13, plotted over the time t. This gate voltage u$_{GE}$ remains in switching state "−15V" up to point in time t3 of the negative switching edge of the desired control signal S*$_T$. At this point in time t3 the second predetermined period of time $\Delta T_2$ is started and the gate voltage u$_{GE}$ changes from switching state "−15V" into switching state "+15V" and remains in this state for the duration of the second predetermined period of time $\Delta T_2$. At point in time t4 this second predetermined period of time $\Delta T_2$ has elapsed. After this second predetermined period of time $\Delta T_2$ has elapsed, the gate voltage u$_{GE}$ changes from switching state "+15V" into switching state "0V" and remains in this switching state until the third predetermined period of time $\Delta T_3$ has elapsed. At point in time t6 a pulse period T$_p$ of the desired control signal S*$_T$ ends and a new pulse period T$_p$ starts.

Figure 3:
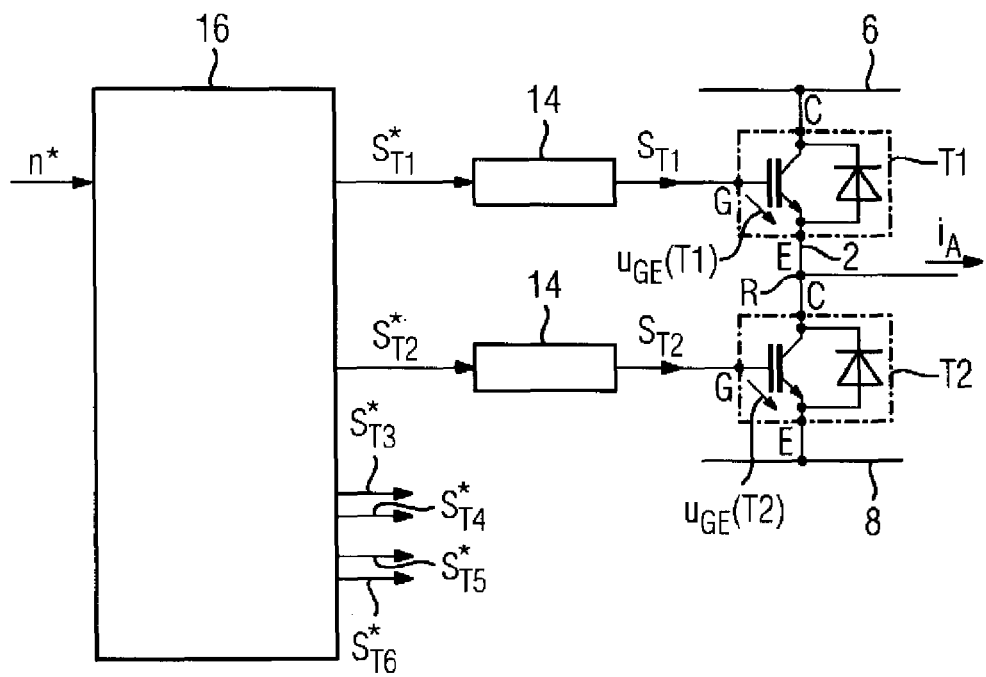
FIG. 3 shows a block diagram of a control and regulation device of a three-phase current converter with the reverse conductive IGBTs as current switching valves.
Figure 4:
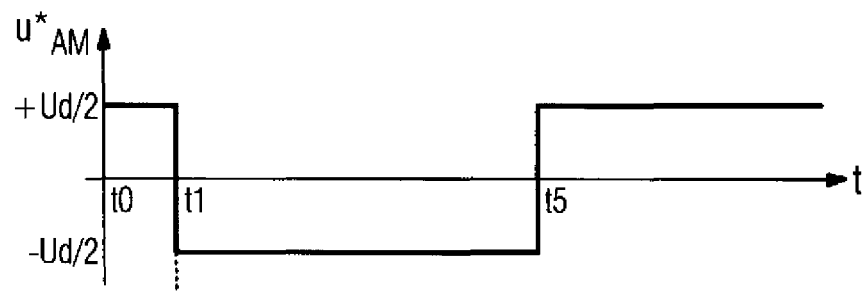
FIGS. 4 to 8 show signal traces of two reverse conductive IGBTs for the case of a negative output current of this half bridge.
Figure 5:
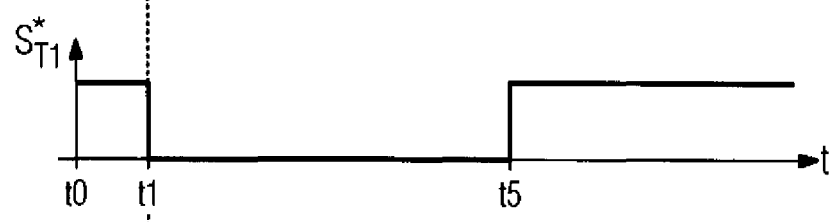
Figure 6:
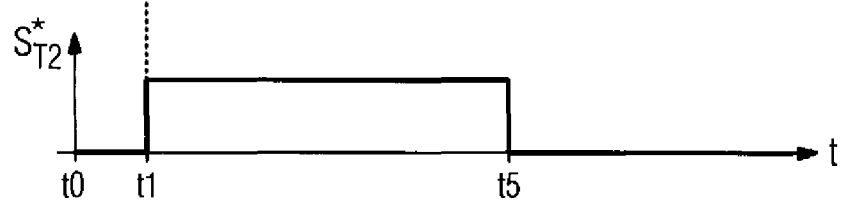
Figure 7:
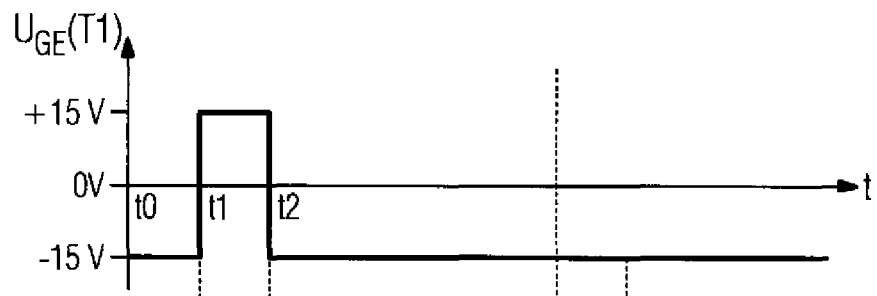
Figure 8:
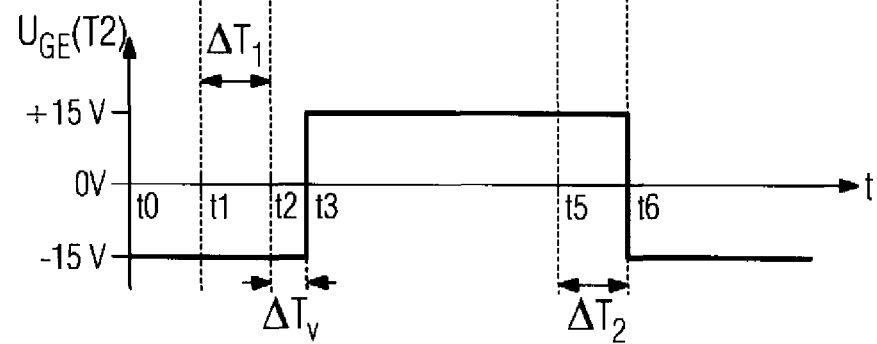
Figure 14:
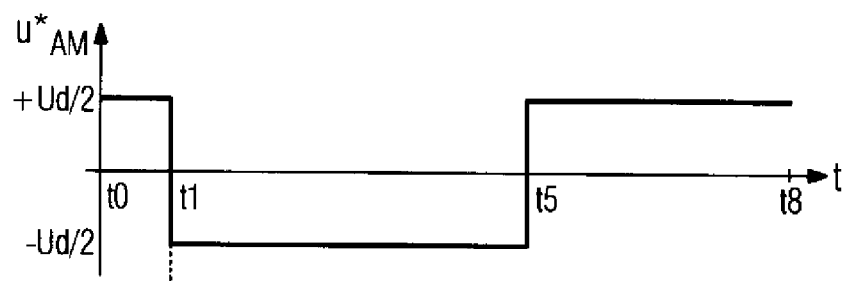
FIGS. 14 to 18 shows signal waveforms of two reverse conductive IGBTs of a half bridge in the event of a negative output current of the half bridge of the inventive method, FIGS. 20 and 22 each show a diagram plotted over time t of gate voltages in accordance with a modified inventive method, while FIGS. 24, 26 and 28, 30 each show in a diagram plotted over time t, gate voltages of further modified inventive methods.
Figure 15:
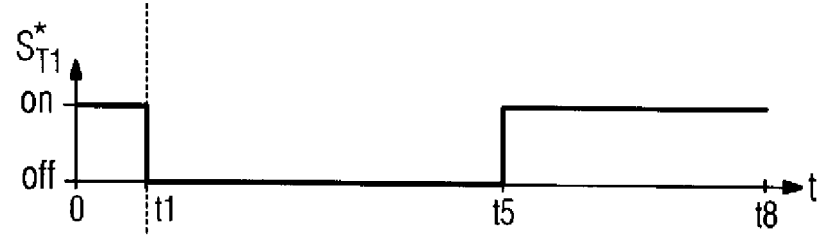
Figure 16:
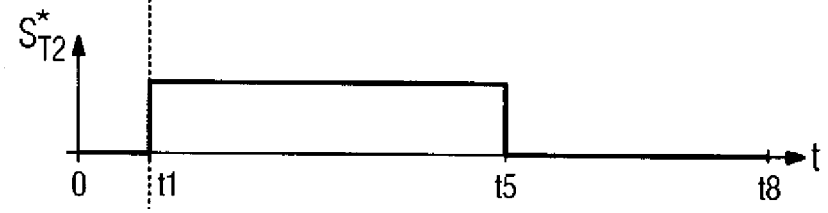
Figure 17:
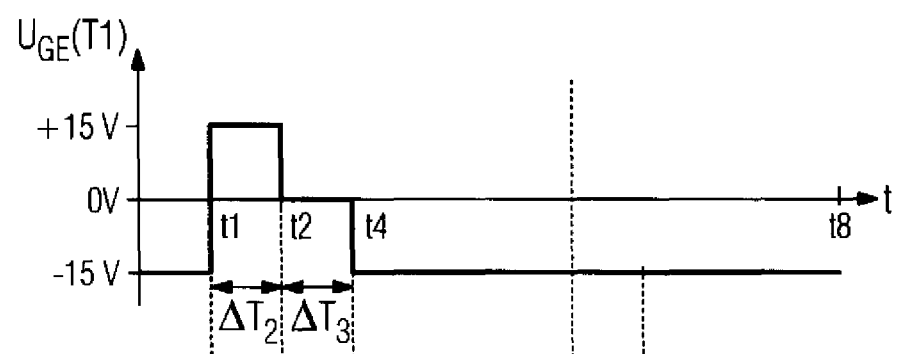
Figure 18:
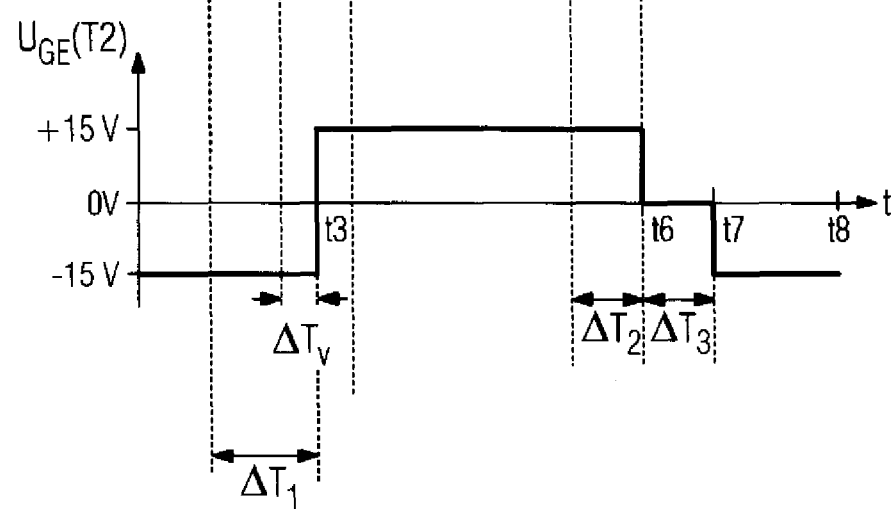
Figure 19:
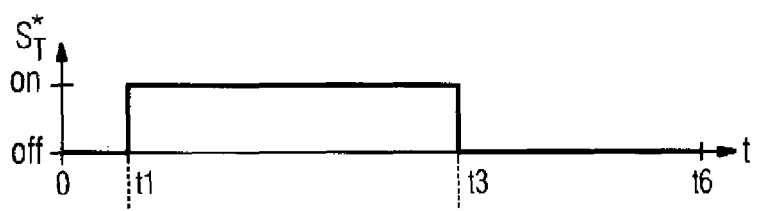

This inventive control of an RC-IGBT operated in IGBT mode and an RC-IGBT operated in diode mode of two electrically series-connected reverse conductive IGBTs of the half bridge 2 is applied in accordance with FIG. 3. The associated signal waveforms are shown in the diagrams of FIGS. 14 to 16. In the diagram of FIG. 14 the waveform of the desired output voltage u*$_{AM}$ over the time t is shown. This waveform corresponds to the waveform of the desired output voltage u*$_{AM}$ of FIG. 4. To enable this desired output voltage u*$_{AM}$ to be converted, the two desired control signals S*$_{T1}$ and S*$_{T2}$ for the two RC-IGBTs T1 and T2 of the half bridge 2 are needed, which are each shown in a diagram plotted over time t in FIGS. 15 and 16. These correspond to the control signals s and ST2 of FIG. 5 and FIG. 6. As already mentioned, for negative polarity of the output current iA of the half bridge 2, the RC-IGBTs T1 is operated in the diode mode and RC-IGBT T2 in IGBT mode. In FIGS. 17 and 18 the waveforms of the respective gate voltages u$_{GE}$(T1) and u$_{GE}$(T2) of the two RC-IGBTs T1 and T2 of the half bridge 2 are shown plotted over time. This means that the gate voltage waveforms in accordance with FIGS. 13 and 11 are entered in accordance with the waveforms of the desired control signals S*$_{T2}$ and S*$_{T2}$ of FIGS. 15 and 16 in FIGS. 17 and 18.

In accordance with the inventive method the RC-IGBT T1 operated in diode mode is in switching state "−15V" during a stationary conductive phase ((t<t1 and t>t7). This means that this RC-IGBT T1 has a minimal on-state voltage. Before the reverse recovery the RC-IGBT T1 operated in diode mode is in the switching state "+15V" (t=t1) and after the second predetermined period of time $\Delta T_2$ has elapsed it is controlled into the switching state "0V". During the second period of time $\Delta T_2$ the RC-IGBT T1 operated in diode mode is current-conductive, whereby the charge carrier concentration decreases. After the second period of time $\Delta T_2$ has elapsed, this RC-IGBT T1 operated in diode mode is switched off again.

Compared to the known control methods the RC-IGBT T1 operated in diode mode is not put into the switching state "−15V" but into the new switching state "0V". This RC-IGBT T1 remains in this new switching state until such time as the third predetermined period of time $\Delta T_3$ has elapsed. During this third period of time $\Delta T_3$ the blocking time $\Delta T_V$ likewise elapses, which has likewise been started after the second predetermined period of time $\Delta T_2$ has elapsed. As soon as this blocking time $\Delta T_V$ has elapsed, the RC-IGBT T2 operated in IGBT mode is changed from switching state "−15V" into switching state "+15V". Thus the commutation of the RC-IGBT T1 operated in diode mode to the RC-IGBT T2 operated in IGBT mode takes place.

In accordance with the inventive method the RC-IGBT T1 operated in diode mode does not go into the switching state (15V) of highly charged carrier concentration again during the third predetermined period of time $\Delta T_3$ but into a state of medium charge carrier concentration, because directly before reverse-recovery this is in the switching state "0V", and not, as in known control methods, in the switching state "−15V". This causes the reverse-recovery charge to fall with the same conductive voltage compared to the prior art. The first object is thus achieved.

When the RC-IGBT T1 operated in diode mode is switched on or switched off, surge current loads occur in the diode direction of this RC-IGBT T1. So that the RC-IGBT T1 operated in diode mode has a higher surge withstand strength, this is in switching state "−15V" (t<t1 and t>t4).

Figure 20:
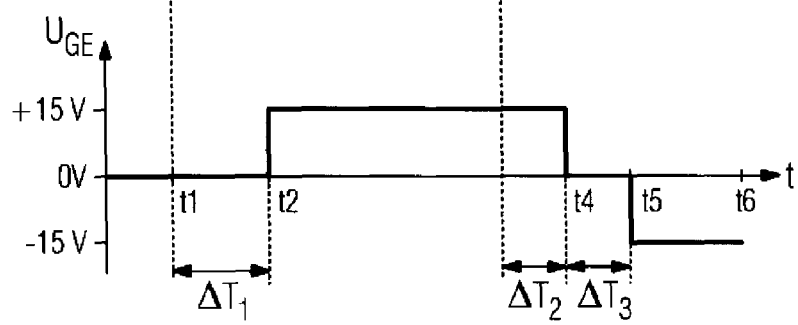
Figure 21:
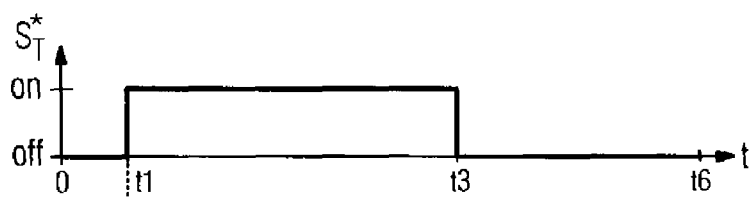
Figure 22:
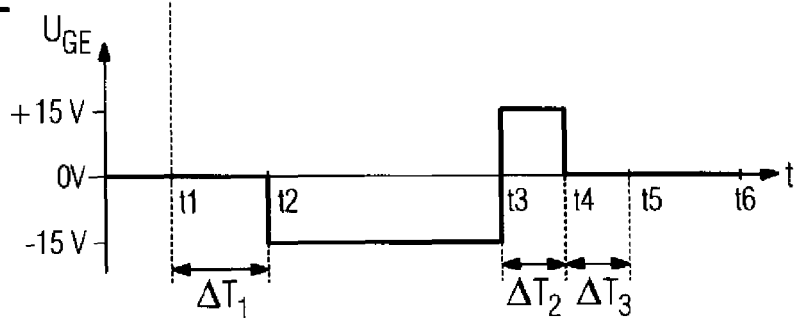
Figure 23:
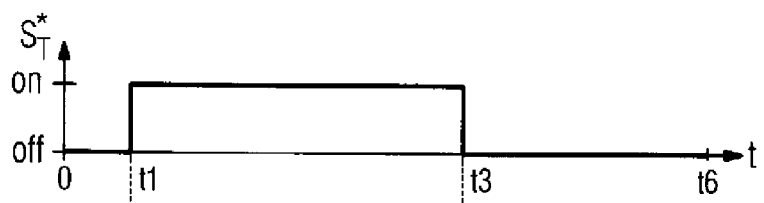
Figure 24:
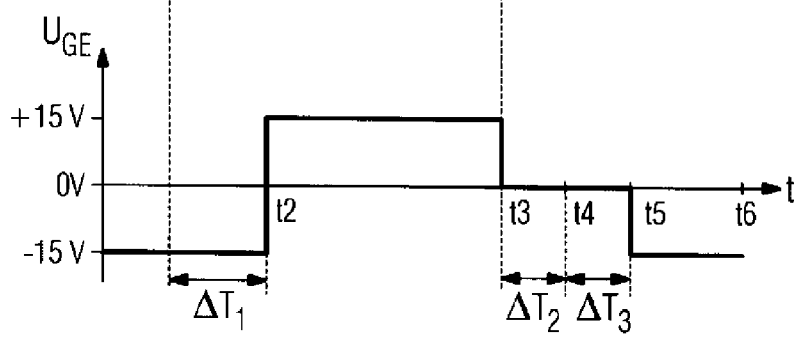
Figure 25:
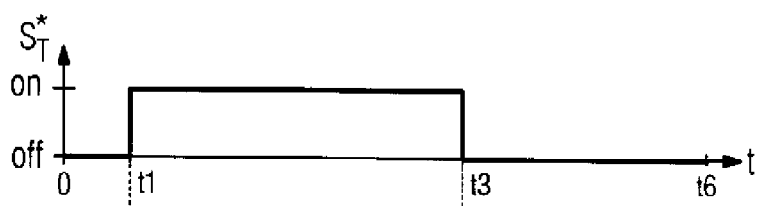
Figure 26:
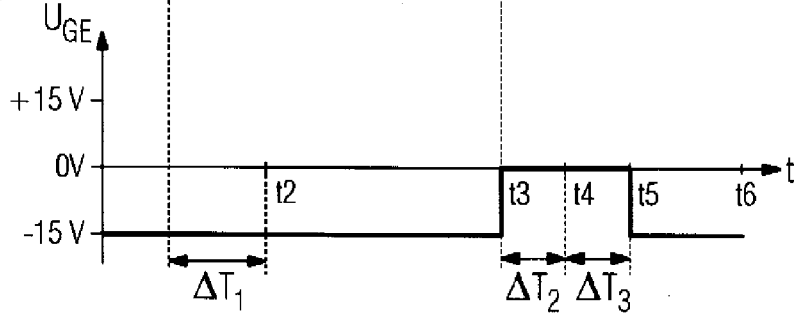
Figure 27:
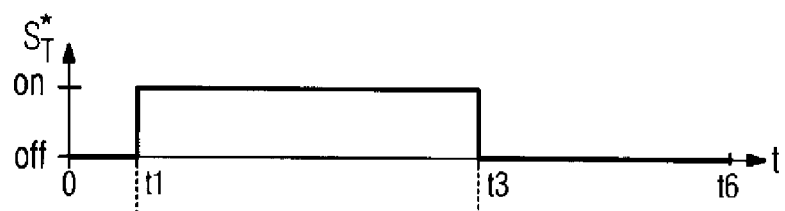
Figure 28:
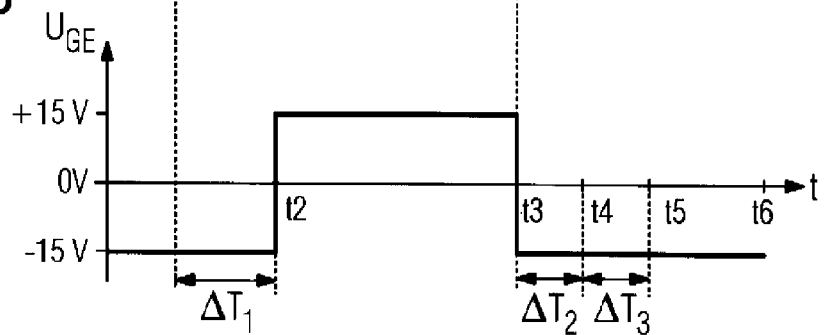
Figure 29:
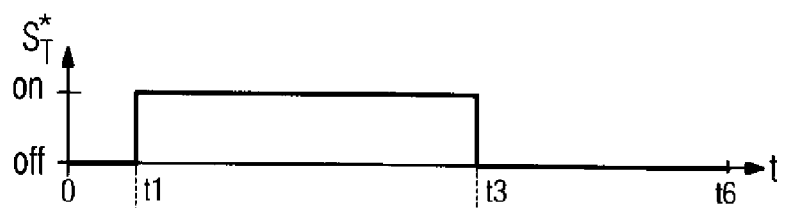

A first modification of the inventive method is shown in FIGS. 20 and 22. The modification consists of the two RC-IGBTs T1 and T2, in the stationary off state (t<t2 and t>t5), not being switched into the switching state "−15V", but into the switching state "0V". With this modification of the inventive method the reverse-recovery charge is lowered only for a conductive voltage which is as low as possible. The surge withstand strength of the RC-IGBT T1 operated in diode mode is not significantly increased.

In a further modification of the inventive method the RC-IGBT operated in diode mode is switched during the desired on state (t1<t<t3 of FIG. 25) and during the stationary blocking state (t<t1 and t>t5 of FIG. 26) into the switching state "−15V". The result achieved by this is that the RC-IGBT operated in diode mode exhibits a high surge withstand strength. Since this RC-IGBT operated in diode mode remains during the second and third predetermined period of time $\Delta T_2$ and $\Delta T_3$ in switching state "0V", the charge carrier concentration does not fall too far during the second predetermined period of time $\Delta T_2$, as in the prior art or in the inventive method (FIG. 13). This charge carrier concentration only increases minimally however even during the third predetermined period of time $\Delta T_3$, since the RC-IGBT operated in diode mode is held during this period of time $\Delta T_3$ in switching state "0V".

Figure 30:
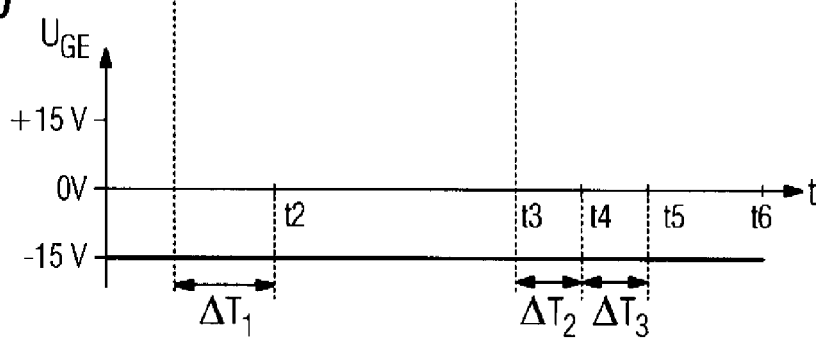

If only a high surge withstand strength is demanded in diode mode of an RC-IGBT, the RC-IGBT operated in diode mode can be put into the second switching state "−15V" during the entire pulse period (FIG. 30). With this modification of the inventive method the reverse recovery charging is not reduced.

So that this inventive method can be realized without any great outlay, the predetermined periods of time $\Delta T_1$, $\Delta T_2$ and $\Delta T_3$ are stored as constant numerical values in the activation facilities 14 of each RC-IGBT T1 or T2 of the half bridge 2 (FIG. 3). For the implementation of the inventive method these three periods of time $\Delta T_1$, $\Delta T_2$ and $\Delta T_3$ are dimensioned so that the following applies: $\Delta T_2 < \Delta T_1 < \Delta T_2 + \Delta T_3$.

The prerequisite for the use of the inventive method consists of the reverse conductive IGBTs having parasitic non-contacted, highly-doped p zones between contacted p-troughs on the front side of the RC-IGBT. Through these parasitic p zones the RC-IGBT now has three switching states ("+15V", "0V" and "−15V") instead of two switching states ("+15V" and "−15V"). According to the invention these parasitic p zones of an RC-IGBT are used explicitly in the control method of this RC-IGBT, in order to primarily if possible obtain a low reverse-recovery charging with a conductive voltage that is as low as possible.

What is claimed is:

1. A method for controlling two electrically series-connected reverse-conductive IGBTs (RC-IBGT) of a half bridge, wherein an operating DC voltage is applied across the series connection, wherein each of the reverse-conductive IGBTs has three switching states "+15V", "0V", "−15V", the method comprising:
   a) setting each of the two reverse-conductive IGBTs to the switching state "−15V" when a nominal control signal associated with the respective reverse-conductive IGBT has a stationary OFF-state,
   b) holding a reverse-conductive IGBT in the switching state "−15V" after a first predetermined period of time has elapsed and following a switch of the nominal control signal from the OFF-state into an ON-state, as long as a current flows from a collector to an emitter,
   c) setting a reverse-conductive IGBT to the switching state "+15V" after the first predetermined period of time has elapsed, as long as a current flow from a collector to an emitter is thereby enabled,
   d) setting each of the reverse-conductive IGBTs into the switching state "+15V" for a third predetermined period of time following a switch of the nominal control signal from the ON-state into the OFF-state, and
   e) setting each of the reverse-conductive IGBTs into the switching state "0V" for a third predetermined period of time after the second predetermined period of time has elapsed.

2. The method of claim 1, wherein the first predetermined period of time is longer than the second predetermined period of time.

3. The method of claim 1, wherein the first predetermined period of time is shorter than a sum of the second and third predetermined periods of time.

4. The method of claim 1, wherein the three predetermined periods of time are stored in a controller which controls the reverse-conductive IGBTs of the half bridge.

5. The method of claim 1, further comprising determining a polarity of a collector current of each reverse-conductive IGBT of the half bridge.

6. The method of claim 5, wherein the polarity of the collector current is determined by evaluating a collector-emitter voltage.

7. A method for controlling two electrically series-connected reverse-conductive IGBTs (RC-IBGT) of a half bridge, wherein an operating DC voltage is applied across the series connection, wherein each of the reverse-conductive IGBTs has three switching states "+15V", "0V", "−15V", the method comprising:
   a) setting each of the two reverse-conductive IGBTs to the switching state "0V" for a first predetermined period of time when a nominal control signal associated with the respective reverse-conductive IGBT has a stationary OFF-state,
   b) after a first predetermined period of time has elapsed and after the nominal control signal has switched from the OFF-state into an ON-state, holding a reverse-conductive IGBT in the switching state "0V", as long as current flows from a collector to an emitter,
   c) after a first predetermined period of time has elapsed and following a switch of the nominal control signal from the OFF-state into the ON-state, setting a reverse-conductive IGBT into the switching state "+15V", provided that a current flow from a collector to an emitter is thereby enabled,
   d) setting each of the reverse-conductive IGBTs into the switching state "+15V" for a second predetermined period of time following a switch of the nominal control signal from the ON-state into the OFF-state, and
   e) setting each of the reverse-conductive IGBTs into the switching state "0V" for a third predetermined period of time after the second predetermined period of time has elapsed.

8. The method of claim 7, wherein the first predetermined period of time is longer than the second predetermined period of time.

9. The method of claim 7, wherein the first predetermined period of time is shorter than a sum of the second and third predetermined periods of time.

10. The method of claim 7, wherein the three predetermined periods of time are stored in a controller which controls the reverse-conductive IGBTs of the half bridge.

11. The method of claim 7, further comprising determining a polarity of a collector current of each reverse-conductive IGBT of the half bridge.

12. The method of claim 11, wherein the polarity of the collector current is determined by evaluating a collector-emitter voltage.

13. A method for controlling two electrically series-connected reverse-conductive IGBTs (RC-IBGT) of a half bridge, wherein an operating DC voltage is applied across the series connection, wherein each of the reverse-conductive IGBTs has three switching states "+15V", "0V", "−15V", the method comprising:
   a) setting each of the reverse-conductive IGBTs to the switching state "−15V" when a nominal control signal associated with the respective reverse-conductive IGBT has a stationary OFF-state,
   b) after a first predetermined period of time has elapsed and after the nominal control signal has switched from the OFF-state into an ON-state, holding a reverse-conductive IGBT in the switching state "−15V", as long as current flows from a collector to an emitter,
   c) after a first predetermined period of time has elapsed and following a switch of the nominal control signal from the OFF-state into the ON-state, setting a reverse-conductive IGBT into the switching state "+15V", provided that a current flow from a collector to an emitter is thereby enabled, d) setting each of the reverse-conductive IGBTs into the switching state "0V" for a second predetermined period of time following a switch of the nominal control signal from the ON-state into the OFF-state, and e) holding each of the reverse-conductive IGBTs in the switching state "0V" for a third predetermined period of time after the second predetermined period of time has elapsed.

14. The method of claim 13, wherein the first predetermined period of time is longer than the second predetermined period of time.

15. The method of claim 13, wherein the first predetermined period of time is shorter than a sum of the second and third predetermined periods of time.

16. The method of claim 13, wherein the three predetermined periods of time are stored in a controller which controls the reverse-conductive IGBTs of the half bridge.

17. The method of claim 13, further comprising determining a polarity of a collector current of each reverse-conductive IGBT of the half bridge.

18. The method of claim 17, wherein the polarity of the collector current is determined by evaluating a collector-emitter voltage.

19. A method for controlling two electrically series-connected reverse-conductive IGBTs (RC-IBGT) of a half bridge, wherein an operating DC voltage is applied across the series connection, wherein each of the reverse-conductive IGBTs has three switching states "+15V", "0V", "−15V", the method comprising:

a) setting each of the reverse-conductive IGBTs to the switching state "−15V" when a nominal control signal associated with the respective reverse-conductive IGBT has a stationary OFF-state, b) after a first predetermined period of time has elapsed and after the nominal control signal has switched from the OFF-state into an ON-state, holding a reverse-conductive IGBT in the switching state "−15V", as long as current flows from a collector to an emitter, c) after a first predetermined period of time has elapsed and following a switch of the nominal control signal from the OFF-state into the ON-state, setting a reverse-conductive IGBT into the switching state "0V", provided that a current flow from a collector to an emitter is thereby enabled, d) setting each of the reverse-conductive IGBTs into the switching state "−15V" for a second predetermined period of time following a switch of the nominal control signal from the ON-state into the OFF-state, and e) setting each of the reverse-conductive IGBTs in the switching state "−15V" for a third predetermined period of time after the second predetermined period of time has elapsed.

20. The method of claim 19, wherein the first predetermined period of time is longer than the second predetermined period of time.

21. The method of claim 19, wherein the first predetermined period of time is shorter than a sum of the second and third predetermined periods of time.

22. The method of claim 19, wherein the three predetermined periods of time are stored in a controller which controls the reverse-conductive IGBTs of the half bridge.

23. The method of claim 19, further comprising determining a polarity of a collector current of each reverse-conductive IGBT of the half bridge.

24. The method of claim 23, wherein the polarity of the collector current is determined by evaluating a collector-emitter voltage.

* * * * *